United States Patent
Pan et al.

(10) Patent No.: US 10,604,863 B2
(45) Date of Patent: Mar. 31, 2020

(54) LITHIUM METABORATE CRYSTAL, PREPARATION METHOD AND USE THEREOF

(71) Applicant: XINJIANG TECHNICAL INSTITUTE OF PHYSICS & CHEMISTRY, CHINESE ACADEMY OF SCIENCES, Urumqi (CN)

(72) Inventors: Shilie Pan, Urumqi (CN); Xinglong Chen, Urumqi (CN); Fangfang Zhang, Urumqi (CN); Xueling Hou, Urumqi (CN)

(73) Assignee: XINJIANG TECHNICAL INSTITUTE OF PHYSICS & CHEMISTRY, CHINESE ACADEMY OF SCIENCES, Urumqi (CN)

(*) Notice: Subject to any disclaimer, the term of this patent is extended or adjusted under 35 U.S.C. 154(b) by 48 days.

(21) Appl. No.: 16/061,670

(22) PCT Filed: Sep. 29, 2016

(86) PCT No.: PCT/CN2016/100752
§ 371 (c)(1),
(2) Date: Jun. 13, 2018

(87) PCT Pub. No.: WO2017/107608
PCT Pub. Date: Jun. 29, 2017

(65) Prior Publication Data
US 2019/0345633 A1    Nov. 14, 2019

(30) Foreign Application Priority Data
Dec. 24, 2015  (CN) .......................... 2015 1 0982616

(51) Int. Cl.
*C30B 29/22*    (2006.01)
*C01B 35/12*    (2006.01)
(Continued)

(52) U.S. Cl.
CPC ............ *C30B 29/22* (2013.01); *C01B 35/121* (2013.01); *C30B 9/12* (2013.01); *C30B 11/003* (2013.01);
(Continued)

(58) Field of Classification Search
None
See application file for complete search history.

(56) References Cited

U.S. PATENT DOCUMENTS 5,215,730 A    6/1993  Rogers et al.

FOREIGN PATENT DOCUMENTS

CN    101603203 A    12/2009
CN    102076892 A    5/2011
(Continued)

OTHER PUBLICATIONS

W. H. Zachariasen et al, The Crystal Structure of Lithium Metaborate, Acta Cryst, 1964, pp. 749-751.

*Primary Examiner* — Guinever S Gregorio
(74) *Attorney, Agent, or Firm* — Bayramoglu Law Offices LLC (57) ABSTRACT

The invention relates to a lithium metaborate crystal and a preparation method and use thereof. The crystal has a chemical formula of $LiBO_2$, a molecular weight of 49.75, and is a member of the monoclinic crystal system. The crystal has a $P2_1/c$ space group and lattice constants of a=5.85(8) Å, b=4.35(7) Å, c=6.46(6) Å, β=115(5)°, and Z=4. The crystal can be applied in wavelengths of infrared-visible-deep ultraviolet, and is grown by utilizing a melt crystallization method or a flux method. The crystal obtained using the method described in the invention is easily grown and processed, and can be used in the manufacture of a polarizing beam splitting prism such as a Glan prism, a Wollaston prism, a Rochon prism or a beam-splitting polar- (Continued)

izer, and other optical components, enabling crucial applications in the fields of optics and communication.

4 Claims, 3 Drawing Sheets

(51) Int. Cl.
    *C30B 9/12*           (2006.01)
    *C30B 11/00*         (2006.01)
    *C30B 15/14*         (2006.01)
    *C30B 17/00*         (2006.01)
    *G02B 1/08*          (2006.01)

(52) U.S. Cl.
    CPC .............. *C30B 15/14* (2013.01); *C30B 17/00* (2013.01); *G02B 1/08* (2013.01); *C01P 2002/76* (2013.01); *C01P 2002/77* (2013.01); *C01P 2006/60* (2013.01); *C01P 2006/80* (2013.01)

(56) References Cited

FOREIGN PATENT DOCUMENTS

| | | |
|---|---|---|
| CN | 102910638 A | 2/2013 |
| CN | 104630887 A | 5/2015 |
| JP | H0753300 A | 2/1995 |
| WO | 2004007352 A2 | 1/2004 |

LITHIUM METABORATE CRYSTAL, PREPARATION METHOD AND USE THEREOF

CROSS REFERENCE TO RELATED APPLICATIONS

This application is the national phase entry of International Application No. PCT/CN2016/100752, filed on Sep. 29, 2016, which is based upon and claims priority to Chinese Patent Application No. 201510982616.8 filed on Dec. 24, 2015, the entire contents of which are incorporated herein by reference.

TECHNICAL FIELD

The invention relates to a lithium metaborate crystal, and the preparation method and use thereof. The crystal has a chemical formula of $LiBO_2$ and can be used in the wavelength range of infrared-visible-deep ultraviolet. The invention belongs to artificial crystal growth technology and optical technology.

BACKGROUND

Birefringence is a phenomenon that light beam, when irradiating upon an anisotropic crystal, splits into two rays that refract in different paths. Crystals that exhibit birefringent phenomenon are called birefringent crystals. Birefringent crystals can be classified into uniaxial crystal and biaxial crystal. Crystals with trigonal, hexagonal and tetragonal systems are uniaxial crystals; whereas crystals with monoclinic, orthorhombic and triclinic systems are biaxial crystals. The birefringent property is an important optical parameter for electro-optical functional material. In recent years, with the fast development of the optical communication technology, birefringent crystals become key materials for polarization splitting prism such as Glan prism and Wollaston prism, and optical communication devices such as opto-isolator, beam shifter and circulator.

Commonly used birefringent crystal materials include $YVO_4$, rutile, $LiNbO_3$, $CaCO_3$, $MgF_2$, and $\alpha$-$BaB_2O_4$ crystals, etc. $YVO_4$ is a kind of artificial birefringent crystal with good qualities; and is easy to grow into large crystals with high optical quality by Czochralski method. However, its optical transmission range is 400-5000 nm and thus cannot be used in the ultraviolet range. Rutile crystal, although possessing a high birefringence, is difficult to be used for manufacturing devices due to its hardness. $LiNbO_3$ crystal can be easily obtained in large sizes, but its birefringence is too low. Calcite is a natural crystal with relatively high content of impurities. The synthesis of calcite is difficult and the crystals are always too small to meet the requirements of large-sized optical polarizers. Regular calcite can be used only in the wavelength range above 350 nm; whereas the calcite of ultraviolet optical grade is not only hard to obtain but also incapable of being used in the deep-ultraviolet range (<200 nm). $MgF_2$ crystal is a good material that can be used in the deep-ultraviolet range. It has a large transmission range (110-8500 nm) but a low birefringence, therefore $MgF_2$ crystal cannot be used for manufacturing Glan prism, but Rochon prism. Nevertheless, its beam separation angle is small and the device is in a large size, which is inconvenient for use. $\alpha$-$BaB_2O_4$, for having solid-state phase transition, is apt to crack in the process of crystal growth. Therefore, it is urgent to explore new birefringent crystal materials that are able to overcome the shortcomings of the current birefringent crystals and satisfy the active demand from the optical communication technology development.

Borates containing alkali or alkaline-earth metal cations possess large optical transmission range and excellent ultraviolet transmission ability, therefore they have important practical value in the optical field especially in the deep-ultraviolet range. The lithium metaborate crystal provided in this invention has the chemical formula of $LiBO_2$. It is a centrosymmetric compound and belongs to monoclinic system. The synthesis and detailed structure of this crystal was first reported in 1964 by W. H. Zachariasen, et al, referring to the reference, Acta Cryst., 17(1964), 749-751. Though there have been some studies about this crystal, the growth of single-crystals in high qualities and large sizes were not reported, neither was their utilization as optical crystals. Our current theoretical studies show that if all of the anion groups in the crystal structure are $BO_3$ and arranged in a parallel or nearly parallel pattern, the birefringence of such a material will tend to be increased. In the structure of the lithium metaborate provided in this invention, the $BO_3$ groups connect each other by sharing corner atoms forming chains in a direction along the b axis, which is beneficial to generate high birefringence. Experimental results have verified that said crystal has very high birefringence, large transmission range and deep-ultraviolet transmission ability, therefore, it is a promising optical material. The method provided in this invention is easy to operate and the crystal grown thereby has good qualities and can be easily used in the fields of birefringent crystal and optical devices, etc.

SUMMARY

The invention is to provide a lithium metaborate crystal and its preparation method. The crystal has a chemical formula of $LiBO_2$, a molecular weight of 49.75, and belongs to the monoclinic crystal system. The crystal has a $P2_1/c$ space group and lattice parameters of $a=5.85(8)$ Å, $b=4.35(7)$ Å, $c=6.46(6)$ Å, $\beta=115.1(5)°$, $Z=4$. The crystal is grown by melt methods or flax methods, wherein the melt methods include top seeded melting method, Czochralski method, Kyropoulos method or Bridgman-Stockbarger method.

Another purpose of the invention is to provide the use of the lithium metaborate crystal $LiBO_2$.

The lithium metaborate crystal provided in the invention has a chemical formula $LiBO_2$, a molecular weight of 49.75, and belongs to the monoclinic crystal system. The crystal has a $P2_1/c$ space group and lattice parameters of $a=5.85(8)$ Å, $b=4.35(7)$ Å, $c=6.46(6)$ Å, $\beta=115.1(5)°$, $Z=4$.

The invention provides a method for preparing the lithium metaborate crystal, wherein such a method is a melt or flux method.

Said melt method for preparing the lithium metaborate crystal comprises detailed steps as follows:

a-1, a lithium-containing compound and a boron-containing compound are mixed in a molar ratio of 1:1 and ground thoroughly. Then the mixture is placed into a corundum crucible and pre-heated at 300° C. for 8 hours. After that, the temperature is increased by 100° C. each time until 800° C., during which, at each temperature, the mixture is kept for 8 hours followed by thorough grind and compaction. When the temperature reaches 800° C., the mixture is held at this temperature for 3-5 days; and then polycrystalline powder of lithium metaborate compound is obtained. After X-ray diffraction analysis, it shows that the X-ray diffraction spectrum of the polycrystalline powder obtained as above is in consistent with that of the powder ground from lithium metaborate single crystal.

b-1, the polycrystalline powder obtained as above is then placed into a platinum crucible; alternatively, a lithium-containing compound and a boron-containing compound are mixed in a molar ratio of 1:1 and placed directly into a platinum crucible. The polycrystalline powder or the mixture is heated to 600-900° C. and kept at this temperature for 1-50 hours to obtain a melt mixture. Said lithium-containing compound is $Li_2O$, $LiOH$, $Li_2CO_3$, $LiNO_3$, $CH_3COOLi$, or $Li_2C_2O_4$. Said boron-containing compound is $H_3BO_3$ or $B_2O_3$.

c-1, Preparation of lithium metaborate seed crystal: the temperature of the melt mixture obtained from step b-1 is reduced by 5-10° C., and held for 2-6 hours. The temperature reducing and holding process is repeated until floating crystal is observed on the surface of the melt mixture. Then the temperature is slowly decreased at a rate of 0.5-10° C./d until crystallization is completed. After that, the temperature is reduced at a rate of 10-50° C./h to room temperature, and lithium metaborate seed crystal is obtained by the spontaneous crystallization.

d-1, the crucible containing the melt mixture obtained from step b-1 is placed into a crystal growth furnace, and the seed crystal obtained from step c-1 is fixed to a seed rod. The temperature is decreased to 560-850° C., and the seed crystal is placed into the hearth from the top of the furnace. After preheated for 1-30 minutes above the surface of the melt mixture, the seed crystal is moved down to or beneath the surface of the melt mixture for remelting. The temperature is kept for 1-20 minutes before reduced to 550-844° C.

e-1, the temperature is reduced slowly at a rate of 0.1-5° C./d and the seed rod is rotated at a rate of 0-30 r/min. At the same time, the crystal is lifted up at a rate of 0-10 mm/h. As growing into a desired size, the crystal is lifted out of the melt mixture and the temperature is reduced to room temperature at a rate of 5-50° C./h. Then the crystal, i.e., lithium metaborate crystal in centimetre-size is obtained and collected from the hearth.

Said flux method for preparing the lithium metaborate crystal comprises steps detailed as follows:

a-2, lithium metaborate compound and flux are mixed and ground thoroughly. The mixture is placed into a platinum crucible, heated to 600-900° C. and kept at this temperature for 1-50 hours to generate a mixed solution containing flux, in which the molar ratio of lithium metaborate and the flux is 1:(0.01-4).

Alternatively, a lithium-containing compound, a boron-containing compound and flux are directly mixed and ground thoroughly in a molar ratio of 1:1:(0.01-4). Then the mixture is placed into a platinum crucible, heated to 600-900° C. and kept at this temperature for 1-50 hours, to generate a mixed solution containing flux. Said lithium-containing compound is $Li_2O$, $LiOH$, $Li_2CO_3$, $LiNO_3$, $CH_3COOLi$ or $Li_2C_2O_4$. Said boron-containing compound is $H_3BO_3$ or $B_2O_3$. Said flux is LiCl, LiBr, LiF, $Li_2O$, LiOH, $Li_2CO_3$, $B_2O_3$, $H_3BO_3$, $Cs_2CO_3$, CsF, $SrCO_3$, $SrF_2$, $Na_2CO_3$, NaF, NaCl, KF, KCl, $K_2CO_3$ or $MoO_3$.

b-2, Preparation of lithium metaborate seed crystal: the temperature of the mixed solution containing flux obtained from step a-2 is reduced rapidly by 5-10° C., and held for 2-6 hours. The temperature reducing and holding process is repeated until floating crystal is observed on the surface of the mixed solution. Then the temperature is slowly decreased at a rate of 0.5-10° C./d until crystallization is completed. After that, the temperature is reduced at a rate of 10-50° C./h to room temperature and lithium metaborate seed crystal is obtained by the spontaneous crystallization.

Alternatively, a platinum wire is fixed to a seed rod and then placed into the mixed solution containing flux obtained from step b-2. The temperature is slowly reduced at a rate of 1-5° C./h until crystal is formed on the platinum wire. Then the rod is rotated at a rate of 0-30 r/min and the temperature is reduced at a rate of 0.1-10° C./d. As growing into a desired size, the crystal is lifted out of the solution, and the temperature is reduced at a rate of 10-50° C./h to room temperature. As a result, lithium metaborate seed crystal is obtained.

c-2, the crucible containing the mixed solution obtained from step a-2 is placed into a crystal growth furnace, and the seed crystal obtained from step b-2 is fixed to a seed rod. The temperature is decreased to 560-850° C., and the seed crystal is placed into the hearth from the top of the furnace. After preheated for 1-30 minutes above the surface of the mixed solution, the seed crystal is moved down to or beneath the surface of the mixed solution for remelting. The temperature is kept for 1-20 minutes before reduced to 550-844° C.

d-2, the temperature is reduced slowly at a rate of 0.1-5° C./d and the seed rod is rotated at a rate of 0-30 r/min. At the same time, the crystal is lifted up at a rate of 0-10 mm/h. As growing into a desired size, the crystal is lifted out of the mixed solution and the temperature is reduced to room temperature at a rate of 5-50° C./h. Then the crystal, i.e., lithium metaborate crystal in centimetre-size is obtained and collected from the hearth.

Said melt method includes top seeded melting method, Czochralski method, Kyropoulos method or Bridgman-Stockbarger method.

Said lithium-containing compound and boron-containing compound have the purity of ≥99.0%.

Said flux has the purity of ≥99.0%.

The lithium metaborate crystal prepared using said method is used for manufacturing polarization splitting prism or optical element.

Said polarization splitting prism is Glan, prism, Wollaston prism, Rochon prism or Beam splitting polarizer.

Said optical element is an opto-isolator, a circulator, a beam shifter, an optical polarizer, an optical modulator, an optical polarimeter, a polarizing beam splitter, a phase-delay device and an electrooptical modulation device.

Said method for preparing the lithium metaborate of the invention involves reaction formulas as follows:

$$Li_2CO_3+2H_3BO_3 \rightarrow LiBO_2+CO_2\uparrow+H_2O\uparrow$$

$$LiOH+H_3BO_3 \rightarrow LiBO_2+H_2O\uparrow$$

$$Li_2O+2H_3BO_3 \rightarrow LiBO_2+H_2O\uparrow$$

$$LiNO_3+H_3BO_3 \rightarrow LiBO_2+NO_2\uparrow+H_2O\uparrow$$

$$Li_2C_2O_4+2H_3BO_3 \rightarrow LiBO_2+CO_2\uparrow+H_2O\uparrow$$

$$LiCH_3COO+H_3BO_3 \rightarrow LiBO_2+CO_2\uparrow+H_2O\uparrow$$

$$Li_2CO_3+B_2O_3 \rightarrow LiBO_2+CO_2\uparrow$$

$$2LiOH+B_2O_3 \rightarrow LiBO_2+H_2O\uparrow$$

$$Li_2O+B_2O_3 \rightarrow LiBO_2$$

$$2LiNO_3+B_2O_3 \rightarrow LiBO_2+NO_2\uparrow$$

$$Li_2C_2O_4+B_2O_3 \rightarrow LiBO_2+CO_2\uparrow$$

$$2LiCH_3COO+B_2O_3 \rightarrow LiBO_2+CO_2\uparrow+H_2O\uparrow$$

The lithium metaborate crystal obtained using the method of the invention can be used in the wavelength range of infrared-visible-deep ultraviolet and is easily grown and processed. Therefore it can be used as optical crystal in the infrared-visible-deep Ultraviolet range. Particularly, said crystal possesses excellent deep ultraviolet transmission ability and high transmittance, thus it is suitable for deep ultraviolet range. Especially its high transmittance and birefringence in the deep ultraviolet range endows the crystal with significant advantages, as compared with other birefringent crystals, so as to compensate the shortages of deep ultraviolet birefringent crystals currently. The method of the invention is apt to prepare crystals in large sizes and high quality. Such crystals are easily processed and thus can be broadly used for preparing polarization splitting prism and optical elements in the infrared-visible-deep ultraviolet range. Therefore, lithium metaborate crystal is a kind of optical crystal material that possesses a great application value.

DETAILED DESCRIPTION OF THE EMBODIMENTS

Example 1. Growth of Lithium Metaborate Crystal by Czochralski Method

Lithium metaborate crystal was produced according to the reaction formula, $Li_2O+2H_3BO_3 \rightarrow LiBO_2+H_2O\uparrow$. The ran materials $Li_2O$ and $H_3BO_3$ used were of analytical grade (≥99%).

$Li_2O$ and $H_3BO_3$ were directly mixed and ground thoroughly in a molar ratio of 1:1 (Li:B) before placed into a platinum crucible. The mixture was slowly heated to 900° C. and kept at this temperature for 24 hours, to form a melt mixture.

Preparation of lithium metaborate seed crystal: the temperature of the melt mixture obtained as above was rapidly reduced by 5° C. each time, and held at such a temperature for 2 hours. The temperature reducing and holding process was repeated until floating crystal was observed on the surface of the melt mixture. Then the temperature was slowly decreased at a rate of 0.5° C./d until crystallization was completed. After that, the temperature was reduced at a rate of 10° C./h to room temperature, and lithium metaborate seed crystal was obtained by the spontaneous crystallization.

The crucible containing the melt mixture obtained as above was placed into a crystal growth furnace, and the seed crystal obtained as above was fixed to the seed rod. The temperature was decreased to 845° C., and the seed crystal was placed into the hearth from the top of the furnace. After preheated for 5 minutes above the surface of the melt mixture, the seed crystal was moved down to the surface of the melt mixture for remelting. The temperature was kept for 1 minute before reduced rapidly to 840° C.

The rod was rotated at a rate of 2 r/min and at the same time, the crystal was lifted up at a rate of 1 mm/h. When crystal began to grow, the quality of the seed crystal was further optimized by shoulder extending and necking down process. Then the lifting rate was kept at 0.5 mm/h, and the temperature was slowly reduced at a rate of 0.1° C./d. The crystal entered an equal-diameter growth process. As the crystal grew into a desired size, the crystal was lifted out of the melt mixture and the temperature was reduced to room temperature at a rate of 10° C./h. Then the crystal, i.e., lithium metaborate crystal with a size of 26×19×33 $mm^3$ was obtained and collected from the hearth.

The lithium metaborate crystal obtained using this method possesses high transparency. Transmission spectrum measurement showed that the crystal had a transmission range of 150-4000 nm and a birefringence of 0.08-0.28.

Example 2. Growth of Lithium Metaborate Crystal by Czochralski Method

Analytically pure (≥99%) lithium metaborate was weighted and placed directly into a platinum crucible. Then the sample was slowly heated to 900° C. and held at this temperature for 5 hours, to form melt mixture.

Preparation of the lithium metaborate seed crystal: a platinum wire fixed to the lower part of a seed rod was placed into the melt mixture, and then the temperature was slowly reduced at a rate of 5° C./h until crystal formed on the platinum wire. Then the rod was rotated at a rate of 5 r/min and the temperature was slowly reduced at a rate of 2° C./d. As growing into a desired size, the crystal was lifted out of the melt mixture and the temperature was decreased to room temperature at a rate of 30° C./h. As a result, lithium metaborate seed crystal was obtained.

The crucible containing the obtained melt mixture was placed into a crystal growth furnace, the obtained seed crystal was fixed to the seed rod, and the temperature was reduced to 845° C. Thereafter, the seed crystal was placed into the hearth from the top of the furnace, and preheated for 5 minutes above the melt surface. Then the seed crystal was moved down to the surface of the melt mixture for remelting. The temperature was held for 1 minute before decreased rapidly to 842° C.

The rod was rotated at a rate of 4 r/min and at the same time, the crystal was lifted up at a rate of 1.5 mm/h. When crystal began to grow, the quality of the seed crystal was further optimized by shoulder extending and necking down process. Then the lifting rate was kept at 0.5 mm/h, and the temperature was slowly reduced at a rate of 0.3° C./d. The crystal entered an equal-diameter growth process. As the crystal grew into a desired size, the crystal was lifted out of the melt mixture and the temperature was reduced to room temperature at a rate of 10° C./h. Then the crystal, i.e., lithium metaborate crystal in a size of 36×29×47 $mm^3$ was obtained and collected from the hearth.

Example 3. Growth of Lithium Metaborate Crystal by Top Seeded Melting Method The lithium metaborate crystal is produced on the basis of the reaction formula, $Li_2CO_3+2H_3BO_3 \rightarrow LiBO_2+CO_2\uparrow+H_2O\uparrow$. Raw materials $Li_2CO_3$ and $H_3BO_3$ used were of analytical grade (≥99%).

$Li_2CO_3$ and $H_3BO_3$ were mixed at a molar ratio of 1:1 (Li:B) and round thoroughly. The mixture was placed into a corundum crucible and pre-heated at 300° C., for 8 hours. After that, the temperature was increased by 100° C. each time until 800° C., during which, at each temperature, the mixture was kept for 8 hours followed by thorough grind and compaction. When the temperature reached 800° C., the mixture was held at this temperature for 5 days; and then polycrystalline powder of lithium metaborate compound was obtained. After X-ray diffraction analysis, it showed that the X-ray diffraction spectrum of the polycrystalline powder obtained above was in consistent with that of the powder ground from lithium metaborate single crystal.

Then the polycrystalline powders of lithium metaborate obtained as above was placed in to a platinum crucible, heated to 900° C. and held at this temperature for 24 hours, to generate melt mixture.

Preparation of the lithium metaborate seed crystal: the temperature of the melt mixture obtained as above was rapidly reduced by 10° C. and held for 6 hours. The temperature reducing and holding process was repeated until floating crystal was observed on the surface of the melt mixture. Then the temperature was slowly decreased at a rate of 10° C./d until crystallization was completed. After that, the temperature was reduced at a rate of 50° C./h to room temperature and lithium metaborate seed crystal was obtained by the spontaneous crystallization.

The crucible containing the obtained melt mixture was placed into a crystal growth furnace, the obtained seed crystal was fixed to the seed rod, and the temperature was reduced to 850° C. Thereafter, the seed crystal was placed into the hearth from the top of the furnace, and preheated for 30 minutes above the surface of the melt mixture. Then the seed crystal was moved down to contact with the surface of the melt mixture for remelting. The temperature was held for 10 minutes before decreased rapidly to 844° C.

Then the temperature was reduced slowly at a rate of 5° C./d and the seed rod was rotated at a rate of 30 r/min, so as to ensure superior growth of the crystal. At the same time, the crystal was lifted up at a rate of 10 mm/h. As growing into a desired size, the crystal was lifted out of the melt mixture and the temperature was reduced to room temperature at a rate of 50° C./h. Then the crystal, i.e., lithium metaborate crystal in a size of 32×76×15 mm$^3$ was obtained and collected from the hearth

Example 4. Growth of Lithium Metaborate Crystal by Kyropoulos Method

The lithium metaborate crystal was produced on the basis of the reaction formula, $LiOH+H_3BO_3 \rightarrow LiBO_2+H_2O\uparrow$. Raw materials LiOH and $H_3BO_3$ used were of analytical grade (≥99%).

LiOH and $H_3BO_3$ were mixed at a molar ratio of 1:1 (Li:B) and ground thoroughly. The mixture was placed into a corundum crucible and pre-heated at 300° C. for 8 hours. After that, the temperature was increased by 100° C. each time until 800° C., during which, at each temperature, the mixture was kept for 8 hours followed by thorough grind and compaction. When the temperature reached 800° C., the mixture was held at this temperature for 3 days; and then polycrystalline powder of lithium metaborate compound was obtained. After X-ray analysis, it showed that the X-ray diffraction spectrum of the polycrystalline powder obtained above was in consistent with that of the powder ground from lithium metaborate single crystal.

Then the polycrystalline powders of lithium metaborate obtained as above was placed in to a platinum crucible, heated to 900° C. and held at this temperature for 12 hours, to generate melt mixture.

Preparation of the lithium metaborate seed crystal: a platinum wire fixed to the lower part of a seed rod was placed into the melt mixture, and then the temperature was slowly reduced at a rate of 5° C./h until crystal formed on the platinum wire. Then the rod was rotated at a rate of 30 r/min and the temperature was slowly reduced at a rate of 10° C./d. As growing into a desired size, the crystal was lifted out of the melt mixture and the temperature was decreased to room temperature at a rate of 50° C./h. As a result, lithium metaborate seed crystal was obtained.

The crucible containing the obtained melt mixture was placed into a crystal growth furnace, the obtained seed crystal was fixed to the seed rod, and the temperature was reduced to 848° C. Thereafter, the seed crystal was placed into the hearth from the top of the furnace, and preheated for 20 minutes above the surface of the melt mixture. Then the seed crystal was moved into the melt mixture for remelting. The temperature was held for 5 minutes before decreased rapidly to 842° C.

Then the temperature was reduced slowly at a rate of 3° C./d and the seed rod was rotated at a rate of 15 r/min, so as to ensure superior growth of the crystal. At the same time, the crystal was lifted up at a rate of 5 mm/h. As growing into a desired size, the crystal was lifted out of the melt mixture and the temperature was reduced to room temperature at a rate of 25° C./h. Then the crystal, i.e., lithium metaborate crystal in a size of 26×19×17 mm$^3$ was obtained and collected from the hearth.

Example 5. Growth of Lithium Metaborate Crystal by Top Seeded Melting Method The lithium metaborate crystal was produced on the basis of the reaction formula, $LiNO_3+H_3BO_3 \rightarrow LiBO_2+NO_2\uparrow+H_2O\uparrow$. Raw materials $LiNO_3$ and $H_3BO_3$ used were of analytical grade (≥99%).

$LiNO_3$ and $H_3BO_3$ were mixed at a molar ratio of 1:1 (Li:B) and around thoroughly. The mixture was placed into a corundum crucible and pre-heated at 300° C. for 8 hours. After that, the temperature was increased by 100° C. each time until 800° C., during which, at each temperature, the mixture was kept for 8 hours followed by thorough grind and compaction. When the temperature reached 800° C., the mixture was held at this temperature for 4 days; then polycrystalline powder of lithium metaborate compound was obtained. After X-ray analysis, it showed that the X-ray diffraction spectrum of the polycrystalline powder obtained above was in consistent with that of the powder ground from lithium metaborate single crystal.

Then the polycrystalline powders of lithium metaborate obtained as above was placed in to a platinum crucible, heated to 900° C. and held at this temperature for 1 hour, to generate melt mixture.

Preparation of the lithium metaborate seed crystal: the temperature of the melt mixture obtained as above was rapidly reduced by 7° C., and held for 4 hours. The temperature reducing and holding process was repeated until floating crystal was observed on the surface of the melt mixture. Then the temperature was slowly decreased at a rate of 5° C./d until crystallization was completed. After that, the temperature was reduced at a rate of 25° C./h to room temperature, and lithium metaborate seed crystal was obtained by the spontaneous crystallization.

The crucible containing the obtained melt mixture was placed into a crystal growth furnace, the obtained seed crystal was fixed to the seed rod, and the temperature was reduced to 847° C. Thereafter, the seed crystal was placed into the hearth from the top of the furnace, and preheated for 1 minute above the surface of the melt mixture. Then the seed crystal was moved down to contact with the surface of the melt mixture for remelting. The temperature was held for 8 minutes before decreased rapidly to 843° C.

Then the temperature was reduced slowly at a rate of 2° C./d and the seed rod was not rotated (at a rate of 0/min). At the same time, the crystal was not lifted up (at a rate of 0 mm/h). As growing into a desired size, the crystal was lifted out of the melt mixture and the temperature was reduced to room temperature at a rate of 30° C./h. Then the crystal, i.e., lithium metaborate crystal in a size of 22×16×9 mm$^3$ was obtained and collected from the hearth.

Example 6. Growth of Lithium Metaborate Crystal by Kyropoulos Method

The lithium metaborate crystal was produced on the basis of the reaction formula, $Li_2CO_3+B_2O_3 \rightarrow LiBO_2+CO_2\uparrow$. Raw materials $Li_2CO_3$ and $B_2O_3$ used were of analytical grade (≥99%).

$Li_2CO_3$ and $B_2O_3$ were placed directly into a platinum crucible after mixed at a molar ratio of 1:1 (Li:B) and ground thoroughly. The mixture was slowly heated to 900° C. and kept at this temperature for 24 hours, to generate melt mixture.

Preparation of the lithium metaborate seed crystal: the temperature of the melt mixture obtained as above was rapidly reduced by 6° C., and held for 3 hours. The temperature reducing and holding process was repeated until floating crystal was observed on the surface of the melt mixture. Then the temperature was slowly decreased at a rate of 8° C./d until crystallization was completed. After that, the temperature was reduced at a rate of 40° C./h to room temperature, and lithium metaborate seed crystal was obtained by the spontaneous crystallization.

The crucible containing the obtained melt mixture was placed into a crystal growth furnace, the obtained seed crystal was fixed to the seed rod, and the temperature was reduced to 846° C. Thereafter, the seed crystal was placed into the hearth from the top of the furnace, and preheated for 10 minutes above the surface of the melt mixture. Then the seed crystal was moved into the melt mixture for remelting. The temperature was held for 3 minutes before decreased rapidly to 841° C.

Then the temperature was reduced slowly at a rate of 1° C./d and the seed rod was rotated at a rate of 5 r/min, so as to ensure superior growth of the crystal. At the same time, the crystal was lifted up at a rate of 0.5 mm/h. As growing into a desired size, the crystal was lifted out of the melt mixture and the temperature was reduced to room temperature at a rate of 10° C./h. Then the crystal, i.e., lithium metaborate crystal in a size of 36×22×34 mm$^3$ was obtained and collected from the hearth.

Example 7. Growth of Lithium Metaborate Crystal by Czochralski Method

The lithium metaborate crystal was produced on the basis of the reaction formula, $2LiOH+B_2O_3 \rightarrow LiBO_2+H_2O\uparrow$. Raw materials LiOH and $B_2O_3$ used were of analytical grade (≥99%).

LiOH and $B_2O_3$ were mixed at a molar ratio of 1:1 (Li:B) and ground thoroughly. The mixture was placed into a corundum crucible and pre-heated at 300° C. for 8 hours. After that, the temperature was increased by 100° C. each time until 800° C., during which, at each temperature, the mixture was kept for 8 hours followed by thorough grind and compaction. When the temperature reached 800° C., the mixture was held at this temperature for 4 days; then polycrystalline powder of lithium metaborate compound was obtained. After X-ray diffraction analysis, it showed that the X-ray diffraction spectrum of the polycrystalline powder obtained above was in consistent with that of the powder ground from lithium metaborate single crystal.

Then the polycrystalline powders of lithium netaborate obtained as above was placed in to a platinum crucible, heated to 900° C. and held at this temperature for 16 hours, to generate melt mixture.

Preparation of the lithium metaborate seed crystal: a platinum wire fixed to the lower part of a seed rod was placed into the melt mixture, and then the temperature was slowly reduced at a rate of 1° C./h until crystal formed on the platinum wire. Then the rod was not rotated (at a rate of 0 r/min) and the temperature was slowly reduced at a rate of 0.1° C./d. As growing into a desired size, the crystal was lifted out of the melt mixture and the temperature was decreased to room temperature at a rate of 10° C./h. As a result, lithium metaborate seed crystal was obtained.

The crucible containing the obtained melt mixture was placed into a crystal growth furnace, the obtained seed crystal was fixed to the seed rod, and the temperature was reduced to 849° C. Thereafter, the seed crystal was placed into the hearth from the top of the furnace, and preheated for 15 minutes above the surface of the melt mixture. Then the seed crystal was moved down to contact with the melt mixture for remelting. The temperature was held for 3 minutes before decreased rapidly to 843.5° C.

Then the temperature was reduced slowly at a rate of 0.1° C./d and the seed rod was rotated at a rate of 2 r/min, so as to ensure superior growth of the crystal. At the same time, the crystal was lifted up at a rate of 0.5 mm/h. As growing into a desired size, the crystal was lifted out of the melt mixture and the temperature was reduced to room temperature at a rate of 5° C./h. Then, the crystal, i.e., lithium metaborate crystal in a size of 36×29×47 mm$^3$ was obtained and collected from the hearth.

Example 8. Growth of Lithium Metaborate Crystal by Flux Method

The lithium metaborate crystal was produced on the basis of the reaction formula, $Li_2C_2O_4+2H_3BO_3 \rightarrow LiBO_2+CO_2\uparrow+H_2O\uparrow$. Raw materials $Li_2C_2O_4$ and $H_3BO_3$ used were of analytical grade (≥99%).

$Li_2C_2O_4$ and $H_3BO_3$ were mixed at a molar ratio of 1:1 (Li:B) and ground thoroughly. The mixture was placed into a corundum crucible and pre-heated at 300° C. for 8 hours. After that, the temperature was increased by 100° C. each time until 800° C., during which, at each temperature, the mixture was kept for 8 hours followed by thorough grind and compaction. When the temperature reached 800° C., the mixture was held at this temperature for 5 days; and then polycrystalline powder of lithium metaborate compound was obtained. After X-ray analysis, it showed that the X-ray diffraction spectrum of the polycrystalline powder obtained above was in consistent with that of the powder ground from lithium metaborate single crystal.

Lithium metaborate compound obtained as above was mixed with the flux $H_3BO_3$ (analytically pure, ≥99%) thoroughly in a molar ratio of 1:0.01 ($LiBOH_2:H_3BO_3$), placed into a platinum crucible, heated to 860° C. and kept at this temperature for 50 hours, to generate a mixed solution containing the lithium metaborate and flux.

Preparation of the lithium metaborate seed crystal: the temperature of the mixed solution obtained as above was rapidly reduced by 5° C., and held for 2 hours. The temperature reducing and holding process was repeated until floating crystal was observed on the surface of the mixed solution. Then the temperature was slowly decreased at a rate of 0.5° C./d until crystallization was completed. After that, the temperature was reduced at a rate of 10° C./h to room temperature, and lithium metaborate seed crystal was obtained by the spontaneous crystallization.

The crucible containing the obtained mixed solution was placed into a crystal growth furnace, the obtained seed crystal was fixed to the seed rod, and the temperature was reduced to 830° C. Thereafter, the seed crystal was placed into the hearth from the top of the furnace, and preheated for 30 minutes above the surface of the mixed solution. Then the seed crystal was moved down to contact with the surface of the mixed solution for remelting. The temperature was held for 1 minute before decreased rapidly to 820° C.

Then the temperature was reduced slowly at a rate of 5° C./d and the seed rod was rotated at a rate of 30 r/min, so as to ensure superior growth of the crystal. At the same time, the crystal was lifted up at a rate of 10 mm/h. As growing into a desired size, the crystal was lifted out of the mixed solution and the temperature was reduced to room temperature at a rate of 50° C./h. Then the crystal, i.e., lithium metaborate crystal in a size of 16×12×17 $mm^3$ was obtained and collected from the hearth.

Example 9. Growth of Lithium Metaborate Crystal by Flux Method

The lithium metaborate crystal was produced on the basis of the reaction formula, $LiCH_3COO+H_3BO_3 \rightarrow LiBO_2+CO_2\uparrow+H_2O\uparrow$. Raw materials $LiCH_3COO$ and $H_3BO_3$ used were of analytical grade (≥99%).

$LiCH_3COO$ and $H_3BO_3$ were weighted in a molar ratio of 1:1 (Li:B), mixed with analytically pure (≥99%) flux LiOH (in a molar ratio of Li:B:LiOH=1:1:1, corresponding to a molar ratio of $LiBO_2$:LiOH=1:1) and ground thoroughly. The mixture was then placed into a platinum crucible, slowly heated to 600° C. and kept at this temperature for 10 hours, to generate a mixed solution containing the lithium metaborate and flux.

Preparation of the lithium metaborate seed crystal: the temperature of the mixed solution obtained as above was rapidly reduced by 10° C., and held for 6 hours. The temperature reducing and holding process was repeated until floating crystal was observed on the surface of the mixed solution. Then the temperature was slowly decreased at a rate of 10° C./d until crystallization was completed. After that, the temperature was reduced at a rate of 50° C./h to room temperature, and lithium metaborate seed crystal was obtained by the spontaneous crystallization.

The crucible containing the obtained mixed solution was placed into a crystal growth furnace, the obtained seed crystal was fixed to the seed rod, and the temperature was reduced to 560° C. Thereafter, the seed crystal was placed into the hearth from the top of the furnace, and preheated for 15 minutes above the surface of the mixed solution. Then the seed crystal was moved into the mixed solution for remelting. The temperature was held for 20 minutes before decreased rapidly to 550° C.

Then the temperature was reduced slowly at a rate of 3° C./d and the seed rod was not rotated (at a rate of 0 r/min). At the same time, the crystal was not lifted up (at a rate of 0 nm/h). As growing into a desired size, the crystal was lifted out of the mixed solution and the temperature was reduced to room temperature at a rate of 30° C./h. Then the crystal, i.e., lithium metaborate crystal in a size of 17×11×6 $mm^3$ was obtained and collected from the hearth.

Example 10. Growth of Lithium Metaborate Crystal by Flux Method

The lithium metaborate crystal was produced on the basis of the reaction formula, $Li_2O+B_2O_3 \rightarrow LiBO_2$. Raw materials $Li_2O$ and $B_2O_3$ used were of analytical grade (≥99%).

$Li_2O$ and $B_2O_3$ were mixed at a molar ratio of 1:1 (Li:B) and ground thoroughly. The mixture was placed into a corundum crucible and pre-heated at 300° C. for 8 hours. After that, the temperature was increased by 100° C. each time until 800° C., during which, at each temperature, the mixture was kept for 8 hours followed by thorough grind and compaction. When the temperature reached 800° C., the mixture was held at this temperature for 4 days; then polycrystalline powder of lithium metaborate compound was obtained. After X-ray diffraction analysis, it showed that the X-ray diffraction spectrum of the polycrystalline powder obtained above was in consistent with that of the powder ground from lithium metaborate single crystal.

The lithium metaborate compound obtained as above was mixed with the flux $Cs_2CO_3$ (analytically pure, ≥99%) thoroughly in a molar ratio of 1:0.02 ($LiBO_2$:flux), placed into a platinum crucible, heated to 760° C. and kept at this temperature for 10 hours, to generate a mixed solution containing the lithium metaborate and flux.

Preparation of the lithium metaborate seed crystal: a platinum wire fixed to a seed rod was placed into the mixed solution, and then the temperature was slowly reduced at a rate of 1° C./h until crystal formed on the platinum wire. Then the rod was rotated at a rate of 5 r/min and the temperature was slowly reduced at a rate of 0.1° C./d. As growing into a desired size, the crystal was lifted out of the mixed solution and the temperature was decreased to room temperature at a rate of 10° C./h. As a result, lithium metaborate seed crystal was obtained.

The crucible containing the obtained mixed solution was placed into a crystal growth furnace, the obtained seed crystal was fixed to the seed rod, and the temperature was reduced to 710° C. Thereafter, the seed crystal was placed into the hearth from the top of the furnace, and preheated for 1 minute above the surface of the mixed solution. Then the seed crystal was moved down to contact with the surface of the mixed solution for remelting. The temperature was held for 15 minutes before decreased rapidly to 702° C.

Then the temperature was reduced slowly at a rate of 1° C./d and the seed rod was rotated at a rate of 15 r/min, so as to ensure superior growth of the crystal. At the same time, the crystal was lifted up at a rate of 5 mm/h. As growing into a desired size, the crystal was lifted out of the mixed solution and the temperature was reduced to room temperature at a rate of 5° C./h. Then the crystal, i.e., lithium metaborate crystal in a size of 19×15×16 mm$^3$ was obtained and collected from the hearth.

Example 11. Growth of Lithium Metaborate Crystal by Flux Method

The lithium metaborate crystal was produced on the basis of the reaction formula, $LiNO_3+B_2O_3 \rightarrow LiBO_2+NO_2\uparrow$. Raw materials $LiNO_3$ and $B_2O_3$ used were of analytical grade (≥99%).

$LiNO_3$ and $B_2O_3$ were weighted in a molar ratio of 1:1 (Li:B), mixed with analytically pure (≥99%) flux CsF (in a molar ratio of Li:B:flux CsF=1:1:0.1, corresponding to a molar ratio of $LiBO_2$:CsF=1:0.1) and ground thoroughly. The mixture was then placed into a platinum crucible, slowly heated to 810° C. and kept at this temperature for 30 hours, to generate a mixed solution containing the lithium metaborate and flux.

Preparation of the lithium metaborate seed crystal: a platinum wire fixed to a seed rod was placed into the mixed solution, and then the temperature was slowly reduced at a rate of 5° C./h until crystal formed on the platinum wire. Then the rod was rotated at a rate of 10 r/min and the temperature was slowly reduced at a rate of 1° C./d. As growing into a desired size, the crystal was lifted out of the mixed solution and the temperature was decreased to room temperature at a rate of 20° C./h. As a result, metaborate seed crystal was obtained.

The crucible containing the obtained mixed solution was placed into a crystal growth furnace, the obtained seed crystal was fixed to the seed rod, and the temperature was reduced to 760° C. Thereafter, the seed crystal was placed into the hearth from the top of the furnace, and preheated for 10 minutes above the surface of the mixed solution. Then the seed crystal was moved into the mixed solution for remelting. The temperature was held for 5 minutes before decreased rapidly to 750° C.

Then the temperature was reduced slowly at a rate of 0.5° C./d and the seed rod was rotated at a rate of 10 r/min. At the same time, the crystal was lifted up at a rate of 3 mm/h. As growing into a desired size, the crystal was lifted out of the mixed solution and the temperature was reduced to room temperature at a rate of 15° C./h. Then the crystal, i.e., lithium metaborate crystal in a size of 21×16×17 mm$^3$ was obtained and collected from the hearth.

Example 12. Growth of Lithium Metaborate Crystal by Flux Method

The lithium metaborate crystal was produced on the basis of the reaction formula, $Li_2C_2O_4+B_2O_3 \rightarrow LiBO_2+CO_2+CO_2\uparrow$. Raw materials $Li_2C_2O_4$ and $B_2O_3$ used were of analytical grade (≥99%).

$Li_2C_2O_4$ and $B_2O_3$ were mixed at a molar ratio of 1:1 (Li:B) and ground thoroughly. The mixture was placed into a corundum crucible and pre-heated at 300° C. for 8 hours. After that, the temperature was increased by 100° C. each time until 800° C., during which, at each temperature, the mixture was kept for 8 hours followed by thorough grind and compaction. When the temperature reached 800° C., the mixture was held at this temperature for 5 days; then polycrystalline powder of lithium metaborate compound was obtained After X-ray diffraction analysis, it showed that X-ray diffraction spectrum of the the polycrystalline powder obtained above was in consistent with that of the powder ground from lithium metaborate single crystal.

The lithium metaborate compound obtained as above was mixed with the flux $Li_2CO_3$ (analytically pure, ≥99%) thoroughly in a molar ratio of 1:0.05 ($LiBO_2$:flux), placed into a platinum crucible, heated to 780° C. and kept at this temperature for 30 hours, to generate a mixed solution containing the lithium metaborate and flux.

Preparation of the lithium metaborate seed crystal: a platinum wire fixed to a seed rod was placed into the mixed solution, and then the temperature was slowly reduced at a rate of 3° C./h until crystal formed on the platinum wire. Then the rod was not rotated (at a rate of 0 r/min) and the temperature was slowly reduced at a rate of 5° C./d. As growing into a desired size, the crystal was lifted out of the mixed solution and the temperature was decreased to room temperature at a rate of 30° C./h. As a result, lithium metaborate seed crystal was obtained.

The crucible containing the obtained mixed solution was placed into a crystal growth furnace, the obtained seed crystal was fixed to the seed rod, and the temperature was reduced to 730° C. Thereafter, the seed crystal was placed into the hearth from the top of the furnace, and preheated for 8 minutes above the surface of the mixed solution. Then the seed crystal was moved down to contact with the surface of the mixed solution for remelting. The temperature was held for 10 minutes before decreased rapidly to 723° C.

Then the temperature was reduced slowly at a rate of 0.1° C./d and the seed rod was rotated at a rate of 2 r/min so as to ensure superior growth of the crystal. At the same time, the crystal was lifted up at a rate of 5 mm/h. As growing into a desired size, the crystal was lifted out of the mixed solution and the temperature was reduced to room temperature by 20° C./h. Then the crystal, i.e., lithium metaborate crystal in a size of 24×17×11 mm$^3$ was obtained and collected from the hearth.

Example 13. Growth of Lithium Metaborate Crystal by Flux Method

The lithium metaborate crystal was produced on the basis of the reaction formula, $2LiCH_3COO+B_2O_3 \rightarrow LiBO_2+CO_2\uparrow+H_2O\uparrow$. Raw materials $LiCH_3COO$ and $B_2O_3$ used were of analytical grade (≥99%).

$LiCH_3COO$ and $B_2O_3$ were weighted in a molar ratio of 1:1 (Li:B), mixed with analytically pure (≥99%) flux LiF (in a molar ratio of Li:B:flux LiF=1:1:0.6, corresponding to a molar ratio of $LiBO_2$:LiF=1:0.6) and ground thoroughly. The mixture was then placed into a platinum crucible, slowly heated to 800° C. and kept at this temperature for 40 hours, to generate a mixed solution containing the lithium metaborate and flux.

Preparation of the lithium metaborate seed crystal: a platinum wire fixed to a seed rod was placed into the mixed solution, and then the temperature was slowly reduced at a rate of 5° C./h until crystal formed on the platinum wire. Then the rod was rotated at a rate of 30 r/min and the temperature was slowly reduced at a rate of 10° C./d. As growing into a desired size, the crystal was lifted out of the mixed solution and the temperature was decreased to room temperature at a rate of 50° C./h. As a result, lithium metaborate seed crystal was obtained.

The crucible containing the obtained mixed solution was placed into a crystal growth furnace, the obtained seed crystal was fixed to the seed rod, and the temperature was reduced to 755° C. Thereafter, the seed crystal was placed into the hearth from the top of the furnace, and preheated for 20 minutes above the surface of the mixed solution. Then the seed crystal was moved into the mixed solution for remelting. The temperature was held for 3 minutes before decreased rapidly to 751° C.

Then the temperature was reduced slowly at a rate of 1.5° C./d and the seed rod was rotated at a rate of 6 r/min. At the same time, the crystal was lifted up at a rate of 2 mm/h. As growing into a desired size, the crystal was lifted out of the mixed solution and the temperature was reduced to room temperature at a rate of 35° C./h. Then the crystal, i.e., lithium metaborate crystal in a size of 22×19×17 mm$^3$ was obtained and collected from the hearth.

Example 14. Growth of Lithium Metaborate Crystal by Flux Method

The lithium metaborate crystal was produced on the basis of the reaction formula, $2LiOH+B_2O_3 \rightarrow LiBO_2+H_2O\uparrow$. Raw materials LiOH and $B_2O_3$ used were of analytical grade (≥99%).

LiOH and $B_2O_3$ were mixed at a molar ratio of 1:1 (Li:B) and ground thoroughly. The mixture was placed into a corundum crucible and pre-heated at 300° C. for 8 hours. After that, the temperature was increased by 100° C. each time until 800° C., during which, at each temperature, the mixture was kept for 8 hours followed by thorough grind and compaction. When the temperature reached 800° C., the mixture was held at this temperature for 3 days; then polycrystalline powder of lithium metaborate compound was obtained. After X-ray diffraction analysis, it showed that the X-ray diffraction spectrum of the polycrystalline powder obtained above was in consistent with that of the powder ground from lithium metaborate single crystal.

The lithium metaborate compound obtained as above was mixed with the flux $B_2O_3$ (analytically pure, ≥99%) thoroughly in a molar ratio of 1:0.15 ($LiBO_2$:flux), placed into a platinum crucible, heated to 815° C. and kept at this temperature for 48 hours, to generate a mixed solution containing the lithium metaborate and flux.

Preparation of the lithium metaborate seed crystal: the temperature of the mixed solution obtained as above was rapidly reduced by 8° C., and held for 4 hours. The temperature reducing and holding process was repeated until floating crystal was observed on the surface of the mixed solution. Then the temperature was slowly decreased at a rate of 5° C./d until crystallization was completed. After that, the temperature was reduced at a rate of 30° C./h to room temperature, and lithium metaborate seed crystal was obtained by the spontaneous crystallization.

The crucible containing the obtained mixed solution was placed into a crystal growth furnace, the obtained seed crystal was fixed to the seed rod, and the temperature was reduced to 765° C. Thereafter, the seed crystal was placed into the hearth from the top of the furnace, and preheated for 10 minutes above the surface of the mixed solution. Then the seed crystal was moved down to contact with the surface of the mixed solution for remelting. The temperature was held for 4 minutes before decreased rapidly to 758° C.

Then the temperature was reduced slowly at a rate of 1° C./d and the seed rod was rotated at a rate of 5 r/min, so as to ensure superior growth of the crystal. At the same time, the crystal was lifted up at a rate of 0.5 mm/h. As growing into a desired size, the crystal was lifted out of the mixed solution and the temperature was reduced to room temperature at a rate of 25° C./h. Then the crystal, i.e., metaborate crystal in a size of 18×15×13 mm$^3$ was obtained and collected from the hearth.

Example 15. Growth of Lithium Metaborate Crystal by Flux Method

The lithium metaborate crystal was produced on the basis of the reaction formula, $Li_2CO_3+2H_3BO_3 \rightarrow CO_2\uparrow+H_2O\uparrow$. Raw materials $Li_2CO_3$ and $H_3BO_3$ used were of analytical grade (≥99%).

$Li_2CO_3$ and $H_3BO_3$ were weighted in a molar ratio of 1:1 (Li:B), mixed with analytically pure (≥99%) flux LiCl (in a molar ratio of Li:B:flux LiCl=1:1:0.5, corresponding to a molar ratio of $LiBO_2$:LiCl=1:0.5) and ground thoroughly. The mixture was then placed into a platinum crucible, slowly heated to 720° C. and kept at this temperature for 24 hours, to generate a mixed solution containing the lithium metaborate and flux.

Preparation of the lithium metaborate seed crystal: the temperature of the mixed solution obtained as above was rapidly reduced by 6° C., and held for 3 hours. The temperature reducing and holding process was repeated until floating crystal was observed on the surface of the mixed solution. Then the temperature was slowly decreased at a rate of 8° C./d until crystallization was completed. After that, the temperature was reduced at a rate of 5° C./h to room temperature, and lithium metaborate seed crystal was obtained by the spontaneous crystallization.

The crucible containing the obtained mixed solution was placed into a crystal growth furnace, the obtained seed crystal was fixed to the seed rod, and the temperature was reduced to 675° C. Thereafter, the seed crystal was placed into the hearth from the top of the furnace, and preheated for 20 minutes above the surface of the mixed solution. Then the seed crystal was moved down to contact with the surface of the mixed solution for remelting. The temperature was held for 5 minutes before decreased rapidly to 667° C.

Then the temperature was reduced slowly at a rate of 2° C./d and the seed rod was rotated at a rate of 8 r/min. At the same time, the crystal was lifted up at a rate of 1 mm/h. As growing into a desired size, the crystal was lifted out of the mixed solution and the temperature was reduced to room temperature at a rate of 20° C./h. Then the crystal, i.e., metaborate crystal in a size of 20×12×16 mm$^3$ was obtained and collected from the hearth.

Example 16. Growth of Lithium Metaborate Crystal by Flux Method

The lithium metaborate crystal was produced on the basis of the reaction formula, $LiOH+H_3BO_3 \rightarrow LiBO_2+H_2O\uparrow$. Raw materials LiOH and $H_3BO_3$ used were of analytical grade (≥99%).

LiOH and $H_3BO_3$ were weighted in a molar ratio of 1:1 (Li:B), mixed with analytically pure (≥99%) flux LiBr (in a molar ratio of Li:B:flux LiBr=1:1:0.3, corresponding to a molar ratio of $LiBO_2$:LiBr=1:0.3) and ground thoroughly. The mixture was then placed into a platinum crucible, slowly heated to 810° C. and kept at this temperature for 12 hours, to generate a mixed solution containing the lithium metaborate and flux.

Preparation of the lithium metaborate seed crystal: a platinum wire fixed to a seed rod was placed into the mixed solution, and then the temperature was slowly reduced at a rate of 4° C./h until crystal formed on the platinum wire. Then the rod was rotated at a rate of 25 r/min and the temperature was slowly reduced at a rate of 2° C./d. As growing into a desired size, the crystal was lifted out of the mixed solution and the temperature was decreased to room temperature at a rate of 20° C./h. As a result, lithium metaborate seed crystal was obtained.

The crucible containing the obtained mixed solution was placed into a crystal growth furnace, the obtained seed crystal was fixed to the seed rod, and the temperature was reduced to 765° C. Thereafter, the seed crystal was placed into the hearth from the top of the furnace, and preheated for 15 minutes above the surface of the mixed solution. Then the seed crystal was moved down to contact with the surface of the mixed solution for remelting. The temperature was held for 3 minutes before decreased rapidly to 756° C.

Then the temperature was reduced slowly at a rate of 2° C./d and the seed rod was rotated at a rate of 10 r/min. At the same time, the crystal was lifted up at a rate of 0.2 mm/h. As growing into a desired size, the crystal was lifted out of the mixed solution and the temperature was reduced to room temperature at a rate of 15° C./h. Then the crystal, i.e., lithium metaborate crystal in a size of 24×21×18 mm$^3$ was obtained and collected from the hearth.

Example 17. Growth of Lithium Metaborate Crystal by Flux Method

The lithium metaborate crystal was produced on the basis of the reaction formula, $Li_2CO_3+B_2O_3 \rightarrow LiBO_2+CO_2\uparrow$. Raw materials $Li_2CO_3$ and $B_2O_3$ used were of analytical grade (≥99%).

$Li_2CO_3$ and $B_2O_3$ were mixed at a molar ratio of 1:1 (Li:B) and ground thoroughly. The mixture was placed into a corundum crucible and pre-heated at 300° C. for 8 hours. After that, the temperature was increased by 100° C. each time until 800° C., during which, at each temperature, the mixture was kept for 8 hours followed by thorough grind and compaction. When the temperature reached 800° C., the mixture was held at this temperature for 3 days; then polycrystalline powder of lithium metaborate compound was obtained. After X-ray diffraction analysis, it showed that the X-ray diffraction spectrum of the polycrystalline powder obtained above was in consistent with that of the powder ground from lithium metaborate single crystal.

The lithium metaborate compound obtained as above was mixed with the flux $MoO_3$ (analytically pure, ≥99%) thoroughly in a molar ratio of 1:4 ($LiBO_2$:flux) placed into a platinum crucible, heated to 700° C. and kept at this temperature for 20 hours, to generate a mixed solution containing the lithium metaborate and flux.

Preparation of the lithium metaborate seed crystal: a platinum wire fixed to a seed rod was placed into the mixed solution, and then the temperature was slowly reduced at a rate of 3° C./h until crystal formed on the platinum wire. Then the rod was not rotated (at a rate of 0 r/min) and the temperature was slowly reduced at a rate of 5° C./d. As growing into a desired size, the crystal was lifted out of the mixed solution and the temperature was decreased to room temperature at a rate of 30° C./h. As a result, lithium metaborate seed crystal was obtained.

The crucible containing the obtained mixed solution was placed into a crystal growth furnace, the obtained seed crystal was fixed to the seed rod, and the temperature was reduced to 660° C. Thereafter, the seed crystal was placed into the hearth from the top of the furnace, and preheated for 8 minutes above the surface of the mixed solution. Then the seed crystal was moved down to contact with the surface of the mixed solution for remelting. The temperature was held for 10 minutes before decreased rapidly to 653° C.

Then the temperature was reduced slowly at a rate of 0.1° C./d and the seed rod was rotated at a rate of 2 r/min, so as to ensure superior growth of the crystal. At the same time, the crystal was lifted up at a rate of 0.5 mm/h. As growing into a desired size, the crystal was lifted out of the mixed solution and the temperature was reduced to room temperature at a rate of 20° C./h. Then the crystal, i.e., lithium metaborate crystal in a size of 16×17×11 mm$^3$ was obtained and collected from the hearth.

Example 18. Growth of Lithium Metaborate Crystal by Flux Method

The lithium metaborate crystal was produced on the basis of the reaction formula, $2LiOH+B_2O_3 \rightarrow LiBO_2+H_2O\uparrow$. Raw materials LiOH and $B_2O_3$ used were of analytical grade (≥99%).

LiOH and $B_2O_3$ were mixed at a molar ratio of 1:1 (Li:B) and ground thoroughly. The mixture was placed into a corundum crucible and pre-heated at 300° C. for 8 hours. After that, the temperature was increased by 100° C. each time until 800° C., during which, at each temperature, the mixture was kept for 8 hours followed by thorough grind and compaction. When the temperature reached 800° C., the mixture was held at this temperature for 3 days; then polycrystalline powder of lithium metaborate compound was obtained. After X-ray diffraction analysis, it showed that the X-ray diffraction spectrum of the polycrystalline powder obtained above was in consistent with that of the powder ground from lithium metaborate-single crystal.

The lithium metaborate compound obtained as above was mixed with the flux $MoO_3$ (analytically pure, ≥99%) thoroughly in a molar ratio of 1:2 ($LiBO_2$:flux), placed into a platinum crucible, heated to 780° C. and kept at this temperature for 20 hours, to generate a mixed solution containing the lithium metaborate and flux.

Preparation of the lithium metaborate seed crystal: a platinum wire fixed to a seed rod was placed into the mixed solution, and then the temperature was slowly reduced at a rate of 3° C./h until crystal formed on the platinum wire. Then the rod was not rotated (at a rate of 0 r/min) and the temperature was slowly reduced at a rate of 2° C./d. As growing into a desired size, the crystal was lifted out of the mixed solution and the temperature was decreased to room temperature at a rate of 30° C./h. As a result, lithium metaborate seed crystal was obtained.

The crucible containing the obtained mixed solution was placed into a crystal growth furnace, the obtained seed crystal was fixed to the seed rod, and the temperature was reduced to 730° C. Thereafter, the seed crystal was placed into the hearth from the top of the furnace, and preheated for 5 minutes above the surface of the mixed solution. Then the seed crystal was moved down to contact with the surface of the mixed solution for remelting. The temperature was held for 10 minutes before decreased rapidly to 721° C.

Then the temperature was reduced slowly at a rate of 0.5° C./d and the seed rod was rotated at a rate of 2 r/min, so as to ensure superior growth of the crystal. At the same time, the crystal was lifted up at a rate of 1 mm/h. As growing into a desired size, the crystal was lifted out of the mixed solution and the temperature was reduced to room temperature by 20° C./h. Then the crystal, i.e., lithium metaborate crystal in a size of 14×10×9 mm$^3$ was obtained and collected from the hearth.

Example 19. Growth of Lithium Metaborate Crystal by Flux Method

The lithium metaborate crystal was produced on the basis of the reaction formula, $2LiCH_3COO+B_2O_3 \rightarrow LiBO_2+CO_2\uparrow+H_2O\uparrow$. Raw materials $LiCH_3COO$ and $B_2O_3$ used were of analytical grade (≥99%).

$LiCH_3COO$ and $B_2O_3$ were weighted in a molar ratio of 1:1 (Li:B), mixed with analytically pure (≥99%) flux KF (in a molar ratio of Li:B:flux KF=1:1:1.5, corresponding to a molar ratio of $LiBO_3$:KF=1:1.5) and ground thoroughly. The mixture was then placed into a platinum crucible, slowly heated to 780° C. and kept at this temperature for 40 hours, to generate a mixed solution containing the lithium metaborate and flux.

Preparation of the lithium metaborate seed crystal: a platinum wire fixed to a seed rod was placed into the mixed solution, and then the temperature was slowly reduced at a rate of 5° C./h until crystal formed on the platinum wire. Then the rod was rotated at a rate of 30 r/min and the temperature was slowly reduced at a rate of 10° C./d. As growing into a desired size, the crystal was lifted out of the mixed solution and the temperature was decreased to room temperature at a rate of 50° C./h. As a result, lithium metaborate seed crystal was obtained.

The crucible containing the obtained mixed solution was placed into a crystal growth furnace, the obtained seed crystal was fixed to the seed rod, and the temperature was reduced to 735° C. Thereafter, the seed crystal was placed into the hearth from the top of the furnace, and preheated for 20 minutes above the surface of the mixed solution. Then the seed crystal was moved into the mixed solution for remelting. The temperature was held for 3 minutes before decreased rapidly to 730° C.

Then the temperature was reduced slowly at a rate of 1° C./d and the seed rod was rotated at a rate of 3 r/min. At the same time, the crystal was lifted up at a rate of 0.1 mm/h. As growing into a desired size, the crystal was lifted out of the mixed solution and the temperature was reduced to room temperature by 30° C./h. Then the crystal, i.e., lithium metaborate crystal in a size of 12×11×5 mm³ was obtained and collected from the hearth.

Example 20. Growth of Lithium Metaborate Crystal by Flux Method

The lithium metaborate crystal was produced on the basis of the reaction formula, $2LiOH+B_2O_3 \rightarrow LiBO_2+H_2O\uparrow$. Raw materials LiOH and $B_2O_3$ used were of analytical grade (≥99%).

LiOH and $B_2O_3$ were mixed at a molar ratio of 1:1 (Li:B) and ground thoroughly. The mixture was placed into a corundum crucible and pre-heated at 300° C. for 8 hours. After that, the temperature was increased by 100° C. each time until 800° C., during which, at each temperature, the mixture was kept for 8 hours followed by thorough grind and compaction. When the temperature reached 800° C., the mixture was held at this temperature for 3 days; then polycrystalline powder of lithium metaborate compound was obtained. After X-ray difraction analysis, it showed that the X-ray diffraction spectrum of the polycrystalline powder obtained above was in consistent with that of the powder ground from lithium metaborate single crystal.

The lithium metaborate compound obtained as above was mixed with the flux KCl (analytically pure, ≥99%) thoroughly in a molar ratio of 1:1($LiBO_2$:KCl), placed into a platinum crucible, heated to 810° C. and kept at this temperature for 20 hours, to generate a mixed solution containing the lithium metaborate and flux.

Preparation of the lithium metaborate seed crystal: a platinum wire fixed to a seed rod was placed into the mixed solution, and then the temperature was slowly reduced at a rate of 2° C./h until crystal formed on the platinum wire. Then the rod was rotated at a rate of 5 r/min and the temperature was slowly reduced at a rate of 1° C./d. As growing into a desired size, the crystal was lifted out of the mixed solution and the temperature was decreased to room temperature at a rate of 30° C./h. As a result, lithium metaborate seed crystal was obtained.

The crucible containing the obtained mixed solution was placed into a crystal growth furnace, the obtained seed crystal was fixed to the seed rod, and the temperature was reduced to 770° C. Thereafter, the seed crystal was placed into the hearth from the top of the furnace, and preheated for 5 minutes above the surface of the mixed solution. Then the seed crystal was moved down to contact with the surface of the mixed solution for remelting. The temperature was held for 10 minutes before decreased rapidly to 740° C.

Then the temperature was reduced slowly at a rate of 0.5° C./d and the seed rod was rotated at a rate of 2 r/min, so as to ensure superior growth of the crystal. At the same time, the crystal was lifted up at a rate of 0.1 mm/h. As growing into a desired size, the crystal was lifted out of the mixed solution and the temperature was reduced to room temperature at a rate of 20° C./h. Then the crystal, i.e. lithium metaborate crystal in a size of 11×10×6 mm³ was obtained and collected from the hearth.

Example 21. Growth of Lithium Metaborate Crystal by Flux Method

The lithium metaborate crystal was produced on the basis of the reaction formula, $2LiOH+B_2O_3 \rightarrow LiBO_2+H_2O\uparrow$. Raw materials LiOH and $B_2O_3$ used were of analytical grade (≥99%).

LiOH and $B_2O_3$ were mixed at a molar ratio of 1:1 (Li:B) and ground thoroughly. The mixture was placed into a corundum crucible and pre-heated at 300° C. for 8 hours. After that, the temperature was increased by 100° C. each time until 800° C., during which, at each temperature, the mixture was kept for 8 hours followed by thorough grind and compaction. When the temperature reached 800° C., the mixture was held at this temperature for 3 days; then polycrystalline powder of lithium metaborate compound was obtained. After X-ray difraction analysis, it showed that the X-ray diffraction spectrum of the polycrystalline powder obtained above was in consistent with that of the powder ground from lithium metaborate single crystal.

The lithium metaborate compound obtained as above was mixed with the flux $K_2CO_3$ (analytically pure, ≥99%) thoroughly in a molar ratio of 1:0.8 ($LiBO_2$:$K_2CO_3$), placed into a platinum crucible, heated to 790° C. and kept at this temperature for 10 hours, to generate a mixed solution containing the lithium metaborate and flux.

Preparation of the lithium metaborate seed crystal: a platinum wire fixed to a seed rod was placed into the mixed solution, and then the temperature was slowly reduced at a rate of 3° C./h until crystal formed on the platinum wire. Then the rod was rotated at a rate of 3 r/min and the temperature was slowly reduced at a rate of 1° C./d. As growing into a desired size, the crystal was lifted out of the mixed solution and the temperature was decreased to room temperature at a rate of 30° C./h. As a result, lithium metaborate seed crystal was obtained.

The crucible containing the obtained mixed solution was placed into a crystal growth furnace, the obtained seed crystal was fixed to the seed rod, and the temperature was reduced to 740° C. Thereafter, the seed crystal was placed into the hearth from the top of the furnace, and preheated for 5 minutes above the surface of the mixed solution. Then the seed crystal was moved down to contact with the surface of the mixed solution for remelting. The temperature was held for 5 minutes before decreased rapidly to 732° C.

Then the temperature was reduced slowly at a rate of 1° C./d and the seed rod was rotated at a rate of 2 r/min, so as to ensure superior growth of the crystal. At the same time, the crystal was lifted up at a rate of 0.2 mm/h. As growing into a desired size, the crystal was lifted out of the mixed solution and the temperature was reduced to room temperature at a rate of 20° C./h. Then the crystal, i.e., lithium metaborate crystal in a size of 13×7×9 mm$^3$ was obtained and collected from the hearth.

Example 22. Growth of Lithium Metaborate Crystal by Flux Method

The lithium metaborate crystal was produced on the basis of the reaction formula, $2LiOH+B_2O_3 \rightarrow LiBO_2+H_2O\uparrow$. Raw materials LiOH and $B_2O_3$ used were of analytical grade (≥99%).

LiOH and $B_2O_3$ were mixed at a molar ratio of 1:1 (Li:B) and ground thoroughly. The mixture was placed into a corundum crucible and pre-heated at 300° C. for 8 hours. After that, the temperature was increased by 100° C. each time until 800° C., during which, at each temperature, the mixture was kept for 8 hours followed by thorough grind and compaction. When the temperature reached 800° C., the mixture was held at this temperature for 3 days; then polycrystalline powder of lithium metaborate compound was obtained. After X-ray diffraction analysis, it showed that the X-ray diffraction spectrum of the polycrystalline powder obtained above was in consistent with that of the powder ground from lithium metaborate single crystal.

The lithium metaborate compound obtained as above was mixed with the flux NaCl (analytically pure, ≥99%) thoroughly in a molar ratio of 1:0.5 (LiBO:NaCl), placed into a platinum crucible, heated to 830° C. and kept at this temperature for 20 hours, to generate a mixed solution containing the lithium metaborate and flux.

Preparation of the lithium metaborate seed crystal: a platinum wire fixed to a seed rod was placed into the mixed solution, and then the temperature was slowly reduced at a rate of 2° C./h until crystal formed on the platinum wire. Then the rod was rotated at a rate of 5 r/min and the temperature was slowly reduced at a rate of 1° C./d. As growing into a desired size, the crystal was lifted out of the mixed solution and the temperature was decreased to room temperature at a rate of 30° C./h. As a result, lithium metaborate seed crystal was obtained.

The crucible containing the obtained mixed solution was placed into a crystal growth furnace, the obtained seed crystal was fixed to the seed rod, and the temperature was reduced to 780° C. Thereafter, the seed crystal was placed into the hearth from the top of the furnace, and preheated for 5 minutes above the surface of the mixed solution. Then the seed crystal was moved down to contact with the surface of the mixed solution for remelting. The temperature was held for 3 minutes before decreased rapidly to 764° C.

Then the temperature was reduced slowly at a rate of 0.5° C./d and the seed rod was rotated at a rate of 5 r/min, so as to ensure superior growth of the crystal. At the same time, the crystal was lifted up at a rate of 0.2 nm/h. As growing into a desired size, the crystal was lifted out of the mixed solution and the temperature was reduced to room temperature at a rate of 20° C./h. Then the crystal, i.e., metaborate crystal in a size of 19×10×11 mm$^3$ was obtained and collected from the hearth.

Example 23. Growth of Lithium Metaborate Crystal by Flux Method

The lithium metaborate crystal was produced on the basis of the reaction formula, $2LiOH+B_2O_3 \rightarrow LiBO_2+H_2O\uparrow$. Raw materials LiOH and $B_2O_3$ used were of analytical grade (≥99%).

LiOH and $B_2O_3$ were mixed at a molar ratio of 1:1 (Li:B) and ground thoroughly. The mixture was placed into a corundum crucible and pre-heated at 300° C. for 8 hours. After that, the temperature was increased by 100° C. each time until 800° C., during which, at each temperature, the mixture was kept for 8 hours followed by thorough grind and compaction. When the temperature reached 800° C., the mixture was held at this temperature for 3 days; then polycrystalline powder of lithium metaborate compound was obtained. After X-ray diffraction analysis, it showed that the X-ray diffraction spectrum of the polycrystalline powder obtained above was in consistent with that of the powder ground from lithium metaborate single crystal.

The lithium metaborate compound obtained as above was mixed with the flux NaF (analytically pure, ≥99%) thoroughly in a molar ratio of 1:2 ($LiBO_2$:NaF), placed into a platinum crucible, heated to 760° C. and kept at this temperature for 5 hours, to generate a mixed solution containing the lithium metaborate and flux.

Preparation of the lithium metaborate seed crystal: a platinum wire fixed to a seed rod was placed into the mixed solution, and then the temperature was slowly reduced at a rate of 5° C./h until crystal formed on the platinum wire. Then the rod was rotated at a rate of 2 r/min and the temperature was slowly reduced at a rate of 1° C./d. As growing into a desired size, the crystal was lifted out of the mixed solution and the temperature was decreased to room temperature at a rate of 30° C./h. As a result, lithium metaborate seed crystal was obtained.

The crucible containing the obtained mixed solution was placed into a crystal growth furnace, the obtained seed crystal was fixed to the seed rod, and the temperature was reduced to 710° C. Thereafter, the seed crystal was placed into the hearth from the top of the furnace, and preheated for 5 minutes above the surface of the mixed solution. Then the seed crystal was moved down to contact with the surface of the mixed solution for remelting. The temperature was held for 3 minutes before decreased rapidly to 704° C.

Then the temperature was reduced slowly at a rate of 0.5° C./d and the seed rod was rotated at a rate of 2 r/min, so as to ensure superior growth of the crystal. At the same time, the crystal was lifted up at a rate of 0.1 mm/h. As growing into a desired size, the crystal was lifted out of the mixed solution and the temperature was reduced to room temperature at a rate of 20° C./h. Then the crystal, i.e., lithium metaborate crystal in a size of 21×11×9 mm$^3$ was obtained and collected from the hearth.

Example 24. Growth of Lithium Metaborate Crystal by Flux Method

Lithium metaborate (analytically pure, ≥99%) was directly mixed with flux $Na_2CO_3$ (analytically pure, ≥99%)

in a molar ratio of 1:0.5 (LiBO$_2$:Na$_2$CO$_3$) and ground thoroughly. Then the mixture was placed into a platinum crucible, heated to 820° C. and kept at this temperature for 8 hours, to generate a mixed solution containing the lithium metaborate and flux.

Preparation of the lithium metaborate seed crystal: a platinum wire fixed to a seed rod was placed into the mixed solution, and then the temperature was slowly reduced at a rate of 3° C./h until crystal formed on the platinum wire. Then the rod was not rotated (at a rate of 0 r/min) and the temperature was slowly reduced at a rate of 1° C./d. As growing into a desired size, the crystal was lifted out of the mixed solution and the temperature was decreased to room temperature at a rate of 30° C./h. As a result, lithium metaborate seed crystal was obtained.

The crucible containing the obtained mixed solution was placed into a crystal growth furnace, the obtained seed crystal was fixed to the seed rod, and the temperature was reduced to 770° C. Thereafter, the seed crystal was placed into the hearth from the top of the furnace, and preheated for 5 minutes above the surface of the mixed solution. Then the seed crystal was moved down to contact with the surface of the mixed solution for remelting. The temperature was held for 5 minutes before decreased rapidly to 762° C.

Then the temperature was reduced slowly at a rate of 1° C./d and the seed rod was rotated at a rate of 2 r/min, so as to ensure superior growth of the crystal. At the same time, the crystal was lifted up at a rate of 0.1 mm/h. As growing into a desired size, the crystal was lifted out of the mixed solution and the temperature was reduced to room temperature at a rate of 30° C./h. Then the crystal, i.e., lithium metaborate crystal in a size of 18×13×8 mm$^3$ was obtained and collected from the hearth.

Example 25. Growth of Lithium Metaborate Crystal by Flux Method

The lithium metaborate crystal was produced on the basis of the reaction formula, Li$_2$CO$_3$+B$_2$O$_3$→LiBO$_2$+CO$_2$↑. Raw materials Li$_2$CO$_3$ and B$_2$O$_3$ used were of analytical grade (≥99%).

Li$_2$CO$_3$ and B$_2$O$_3$ were mixed at a molar ratio of 1:1 (Li:B) and ground thoroughly. The mixture was placed into a corundum crucible and pre-heated at 300° C. for 8 hours. After that, the temperature was increased by 100° C. each time until 800° C., during which, at each temperature, the mixture was kept for 8 hours followed by thorough grind and compaction. When the temperature reached 800° C., the mixture was held at this temperature for 3 days; then polycrystalline powder of lithium metaborate compound was obtained. After X-ray diffraction analysis, it showed that the X-ray diffraction spectrum of the polycrystalline powder obtained above was in consistent with that of the powder ground from lithium metaborate single crystal.

The lithium metaborate compound obtained as above was mixed with the flux SrCO$_3$ (analytically pure, ≥99%) thoroughly in a molar ratio of 1:0.2 (LiBO$_2$:SrCO$_3$) placed into a platinum crucible, heated to 760° C. and kept at this temperature for 8 hours, to generate a mixed solution containing the lithium metaborate and flux.

Preparation of the lithium metaborate seed crystal: a platinum wire fixed to a seed rod was placed into the mixed solution, and then the temperature was slowly reduced at a rate of 3° C./h until crystal formed on die platinum wire. Then the rod was rotated at a rate of 2 r/min and the temperature was slowly reduced at a rate of 1° C./d. As growing into a desired size, the crystal was lifted out of the mixed solution, and the temperature was decreased to room temperature at a rate of 30° C./h. As a result, lithium metaborate seed crystal was obtained.

The crucible containing the obtained mixed solution was placed into a crystal growth furnace, the obtained seed crystal was fixed to the seed rod, and the temperature was reduced to 720° C. Thereafter, the seed crystal was placed into the hearth from the top of the furnace, and preheated for 10 minutes above the surface of the mixed solution. Then the seed crystal was moved down to contact with the surface of the mixed solution for remelting. The temperature was held for 5 minutes before decreased rapidly to 712° C.

Then the temperature was reduced slowly at a rate of 1° C./d and the seed rod was rotated at a rate of 2 r/min, so as to ensure superior growth of the crystal. At the same time, the crystal was lifted up at a rate of 0.1 mm/h. As growing into a desired size, the crystal was lifted out of the mixed solution and the temperature was reduced to room temperature at a rate of 30° C./h. Then the crystal, lithium metaborate crystal in a size of 19×10×12 mm$^3$ was obtained and collected from the hearth.

Example 26. Growth of Lithium Metaborate Crystal by Flux Method

The lithium metaborate crystal was produced on the basis of the reaction formula, Li$_2$CO$_3$+B$_2$O$_3$→LiBO$_2$+CO$_2$↑. Raw materials Li$_2$CO$_3$ and B$_2$O$_3$ used were of analytical grade (≥99%).

Li$_2$CO$_3$ and B$_2$O$_3$ were mixed at a molar ratio of 1:1 (Li:B) and ground thoroughly. The mixture was placed into a corundum crucible and pre-heated at 300° C. for 8 hours. After that, the temperature was increased by 100° C. each time until 800° C., during which, at each temperature, the mixture was kept for 8 hours followed by thorough grind and compaction. When the temperature reached 800° C., the mixture was held at this temperature for 3 days; then polycrystalline powder of lithium metaborate compound was obtained. After X-ray diffraction analysis, it showed that the X-ray diffraction spectrum of the polycrystalline powder obtained above was in consistent with that of the powder ground from lithium metaborate single crystal.

The lithium metaborate compound obtained as above was mixed with the flux SrF$_2$ (analytically pure, ≥99%) thoroughly in a molar ratio of 1:0.1 (LiBO$_2$:SrF$_2$), placed into a platinum crucible, heated to 790° C. and kept at this temperature for 15 hours, to generate a mixed solution containing the lithium metaborate and flux.

Preparation of the lithium metaborate seed crystal: a platinum wire fixed to a seed rod was placed into the mixed solution, and then the temperature was slowly reduced at a rate of 3° C./h until crystal formed on the platinum wire. Then the rod was rotated at a rate of 2 r/min and the temperature was slowly reduced at a rate of 1° C./d. As growing into a desired size, the crystal was lifted out of the mixed solution and the temperature was decreased to room temperature at a rate of 30° C./h. As a result, lithium metaborate seed crystal was obtained.

The crucible containing the obtained mixed solution was placed into a crystal growth furnace, the obtained seed crystal was fixed to the seed rod, and the temperature was reduced to 740° C. Thereafter, the seed crystal was placed into the hearth from the top of the furnace, and preheated for 10 minutes above the surface of the mixed solution. Then the seed crystal was moved down to contact with the surface of the mixed solution for remelting. The temperature was held for 8 minutes before decreased rapidly to 733° C.

Then the temperature was reduced slowly at a rate of 0.5° C./d and the seed rod was rotated at a rate of 2 r/min, so as to ensure superior growth of the crystal. At the same time, the crystal was lifted up at a rate of 0.2 mm/h. As growing into a desired size, the crystal was lifted out of the mixed solution and the temperature was reduced to room temperature at a rate of 20° C./h. Then the crystal, i.e., metaborate crystal in a size of 14×12×9 mm$^3$ was obtained and collected from the hearth.

Example 27. Growth of Lithium Metaborate Crystal by Bridgman-Stockbarger Method The seed crystal obtained from anyone of Examples 1-26 was placed into the seed groove at the bottom of a crucible. Analytically pure (≥99%) LiBO$_2$ and B$_2$O$_3$ were mixed in a molar ratio of 1:1.02 (Li:B) and ground thoroughly: then placed into the crucible. The crucible was covered by a lid and placed into a furnace with temperature gradient. The temperature was increased to 870° C. and kept for 20 hours. Then the crucible was moved downwards at a rate of 0.5 mm/h. When crystallization was completed, the temperature was reduced to room temperature at a rate of 50° C./h. As a result, lithium metaborate crystal in a size of 34×29×28 mm$^3$ was obtained.

Example 28. Growth of Lithium Metaborate Crystal by Bridgman-Stockbarger Method The seed crystal obtained from anyone of Examples 1-26 was placed into the seed groove at the bottom of a crucible. Li$_2$CO$_3$ and B$_2$O$_3$ were mixed in a molar ratio of 1:1.06 (Li:B) and ground thoroughly. The mixture was sintered before added into the crucible. Thereafter the crucible was covered by a lid and placed into a furnace with temperature gradient. The temperature was increased to 865° C. and held for 10 hours. Then the crucible was moved downwards at a rate of 1 mm/h. When crystallization was completed, the temperature was reduced to room temperature at a rate of 10° C./h. As a result, lithium metaborate crystal in a size of 37×31×34 mm$^3$ was obtained.

Example 29. Growth of Lithium Metaborate Crystal by Bridgman-Stockbarger Method The seed crystal obtained from anyone of Examples 1-26 was placed into the seed groove at the bottom of a crucible. Then analytically pure (≥99%) LiBO$_2$ was added into the crucible. The crucible was covered by a lid and placed into a furnace with temperature gradient. The temperature was increased to 880° C. and held for 1 hour. Then the crucible was moved downwards at a rate of 2 mm/h. When crystallization was completed, the temperature was reduced to room temperature at a rate of 30° C./h. As a result, lithium metaborate crystal in a size of 34×29×28 mm$^3$ was obtained.

Example 30. Growth of Lithium Metaborate Crystal by Bridgman-Stockbarger Method The seed crystal obtained from anyone of Examples 1-26 was placed into the seed groove at the bottom of a crucible. LiNO$_3$ and B$_2$O$_3$ were mixed in a molar ratio of 1:1.1 (Li:B) and ground thoroughly. The mixture was sintered before added into the crucible. Thereafter the crucible was, covered by a lid and placed into a furnace with temperature gradient. The temperature was increased to 850° C. and held for 5 hours. Then the crucible was moved downwards at a rate of 0.1 mm/h. When crystallization was completed, the temperature was reduced to room temperature at a rate of 20° C./h. As a result, lithium metaborate crystal in a size of 35×28×31 mm$^3$ was obtained.

Example 31

Figure 1:
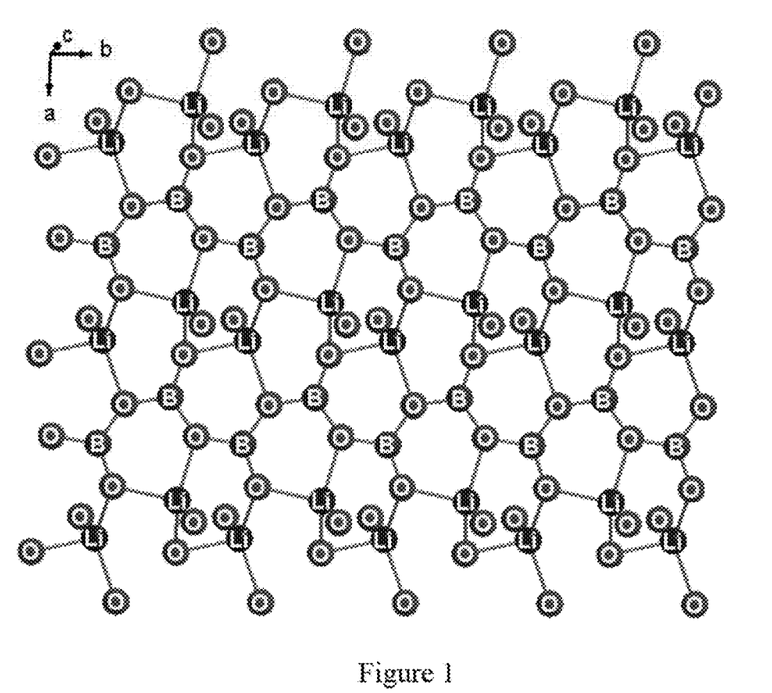
FIG. 1 shows the structure of the lithium metaborate crystal used in the infrared-visible-deep ultraviolet range.
Figure 2:
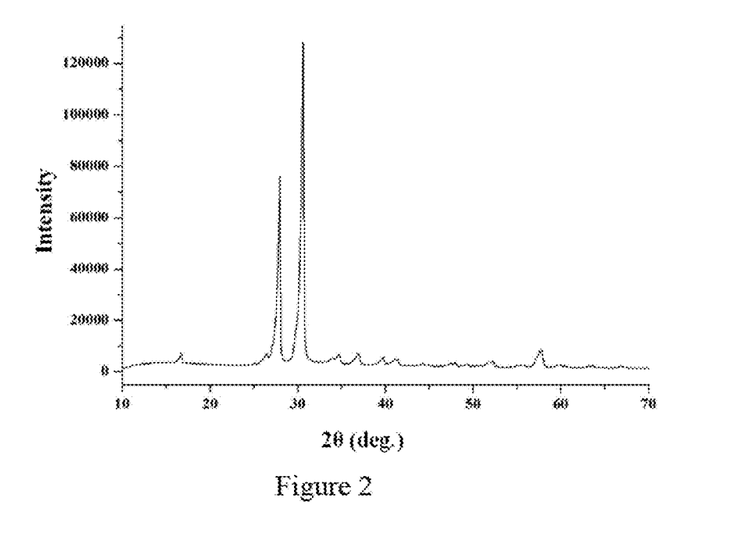
FIG. 2 shows a XRD spectrum of the lithium metaborate crystal used in the infrared-visible-deep ultraviolet range.
Figure 3:
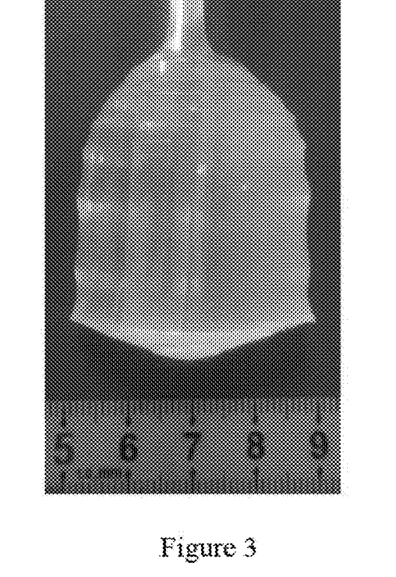
FIG. 3 shows a photograph of the lithium metaborate crystal used in the infrared-visible-deep ultraviolet range.
Figure 4:
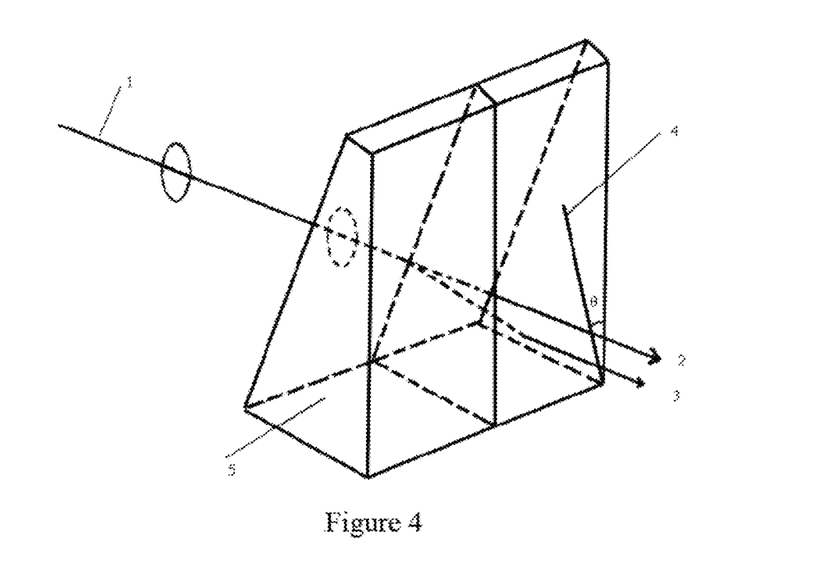
FIG. 4 shows a schematic diagram of the wedge-shaped birefringent crystal polarization splitter made by the lithium metaborate crystal obtained in the invention.

The LiBO$_2$ crystal obtained from anyone of Examples 1-30 was used to manufacture a wedge-shaped birefringent crystal polarization splitter (as shown in FIG. 4). As a wedge-shaped birefringent crystal, it optic axis was in the direction shown in FIG. 4. When irradiating upon and through the crystal, a natural light beam splited into two rays of linearly polarized light. The larger the birefringence was, the farther the two rays were separated apart, which benefits beam separation.

Example 32

Figure 5:
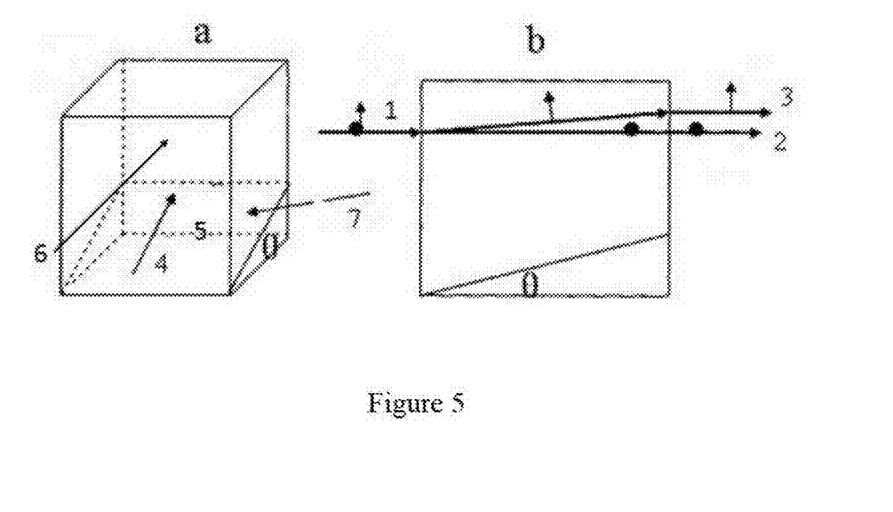
FIG. 5 shows a schematic diagram of the beam shifter made by the lithium metaborate crystal obtained in the invention, in which 1 represents incident light 2 represents light o (ordinary light). 3 represents light e (extraordinary light), 4 represents optical axis, 5 represents $LiBO_2$ crystal, 6 represents light direction, and 7 represents optic axial plane.

The LiBO$_2$ crystal obtained from anyone of Examples 1-30 was used to manufacture a beam shifter. Birefringent crystal was processed to have an angle θ between its optic axial plane and edge (as shown in FIG. 5a). When irradiating upon the crystal vertically, a natural light beam splited into two rays of linearly polarized light vibrating in directions vertical to each other (as shown in FIG. 5b), namely, light o and light e, respectively. The larger the birefringence was, the farther the two rays were separated apart, which benefits beam separation.

Example 33

Figure 6:
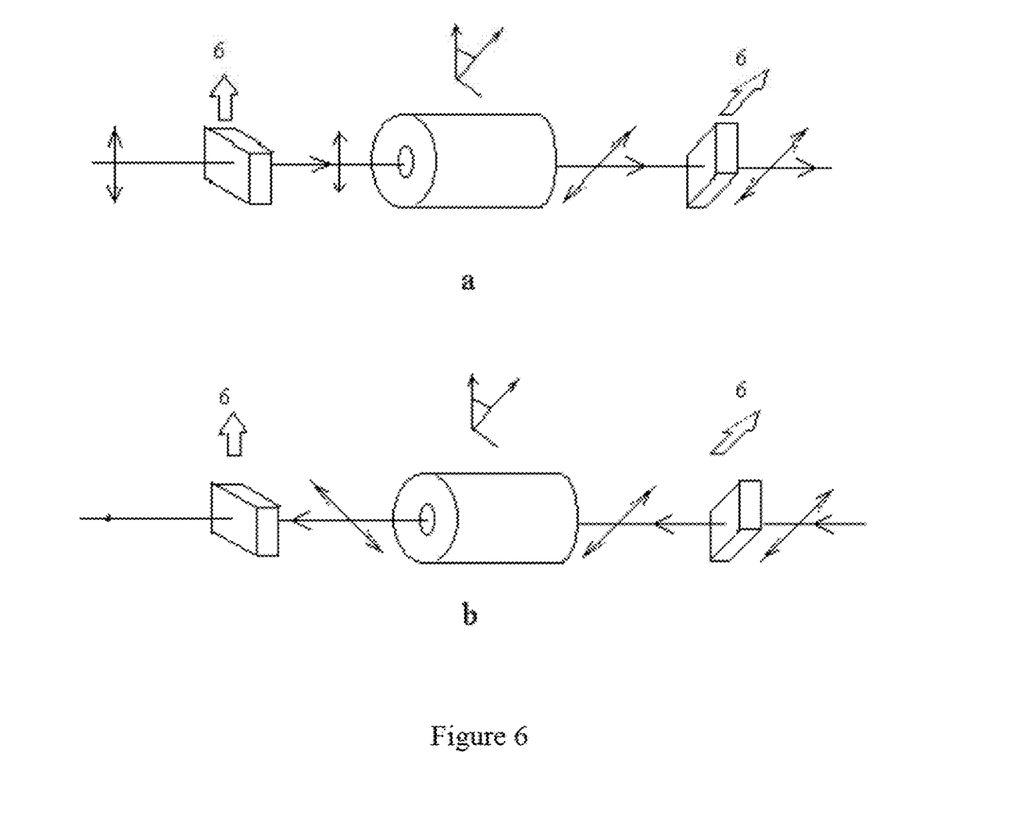
FIG. 6 shows a schematic diagram of the optical isolator made by the lithium metaborate crystal obtained in the invention.

The LiBO$_2$ crystal obtained from anyone of Examples 1-30 was used to manufacture an opto-isolator. An opto-isolator was constructed by placing a Faraday rotator, whose incident beam polarization plane had been rotated 45 between two birefringent crystal deflectors arranged at a cross angle of 45°. This opto-isolator only allowed the forward transmitting incident light to pass through the system, but interrupted the backward transmitting light. FIG. 6a shows that an incident light passed through the system, whereas FIG. 6b shows that the reflecting light was interrupted.

The invention claimed is:

1. A method for preparing the lithium metaborate crystal, wherein said method is a melt method or a flux method, and said melt method comprises the steps of:
   a-1) mixing and grinding a lithium-containing compound and a boron-containing compound in a molar ratio of 1:1 to obtain a first mixture; placing the first mixture into a corundum crucible and pre-heating the first mixture at 300° C. for 8 hours; increasing the temperature by 100° C. five times, until 800° C., wherein the first mixture is kept for 8 hours at each temperature, and is subject to grind and compaction at the each temperature after being kept for 8 hours, and when the temperature reaches 800° C., the first mixture is held at temperature of 800° C. for 3-5 days; and obtaining polycrystalline powder of lithium metaborate compound;
   b-1) placing the polycrystalline powders of lithium metaborate into a platinum crucible; alternatively, mixing and grinding the lithium-containing compound and a boron-containing compound in a molar ratio of 1:1 to obtain a second mixture and placing the second mixture directly into the platinum crucible; heating the polycrystalline powders or the second mixture to 600-900°

C. and holding the polycrystalline powders or the second mixture at temperature of 600-900° C. for 1-50 hours, to form a melt mixture, wherein the lithium-containing compound is $Li_2O$, $LiOH$, $Li_2CO_3$, $LiNO_3$, $CH_3COOLi$, or $Li_2C_2O_4$, and said boron-containing compound is $H_3BO_3$ or $B_2O_3$;

c-1) preparing lithium metaborate seed crystal, wherein the temperature of the melt mixture obtained from step b-1) is reduced by 5-10° C., and the melt mixture is kept for 2-6 hours at each temperature; the temperature reducing and holding process is repeated until a floating crystal is observed on the surface of the melt mixture; then the temperature is slowly decreased at a rate of 0.5-10° C./d until crystallization is completed; after that, the temperature is reduced at a rate of 10-50° C./h to room temperature, and the lithium metaborate seed crystal is obtained;

d-1) placing the platinum crucible that contains the melt mixture obtained from step b-1) into a crystal growth furnace, fixing the lithium metaborate seed crystal obtained from step c-1) to a seed rod, decreasing the temperature of the crystal growth furnace to 560-850° C., and placing the rod into the hearth from the top of the crystal growth furnace; thereafter preheating the lithium metaborate seed crystal for 1-30 minutes above a surface of the melt mixture and then moving the lithium metaborate seed crystal down to or beneath the surface of the melt mixture for remelting; keeping the temperature for 1-20 minutes before decreasing the temperature to 550-844° C.;

e-1) reducing the temperature slowly at a rate of 0.1-5° C./d, rotating the rod at a rate of 0-30 r/min, and lifting up the lithium metaborate seed crystal at a rate of 0-10 mm/h simultaneously; then lifting the lithium metaborate seed crystal out of the melt mixture when the lithium metaborate seed crystal grows into a desired size and reducing the temperature to room temperature at a rate of 5-50° C./h; thereafter collecting the lithium metaborate seed crystal from the hearth to obtain lithium metaborate crystal in centimetre-size;

and wherein said flux method comprises the steps of:

a-2) mixing and grinding lithium metaborate compound and flux to obtain a third mixture; placing the third mixture into a platinum crucible, heating the third mixture to 600-900° C. and keeping the third mixture at temperature of 600-900° C. for 1-50 hours, to generate a mixed solution containing flux, wherein a molar ratio of lithium metaborate and the flux is 1:(0.01-4);

or, mixing and grinding the lithium-containing compound, boron-containing compound and flux in a molar ratio of 1:1:(0.01-4) to generate a fourth mixture containing flux, placing the fourth mixture into a platinum crucible, heating the fourth mixture to 600-900° C. and keeping the fourth mixture at temperature of 600-900° C. for 1-50 hours, to generate a mixed solution containing flux; wherein the lithium-containing compound is $Li_2O$, $LiOH$, $Li_2CO_3$, $LiNO_3$, $CH_3COOLi$ or $Li_2C_2O_4$; the boron-containing compound is $H_3BO_3$ or $B_2O_3$; the flux is $LiCl$, $LiBr$, $LiF$, $Li_2O$, $LiOH$, $Li_2CO_3$, $B_2O_3$, $H_3BO_3$, $Cs_2CO_3$, $CsF$, $SrCO_3$, $SrF_2$, $Na_2CO_3$, $NaF$, $NaCl$, $KF$, $KCl$, $K_2CO_3$ or $MoO_3$;

b-2) preparing lithium metaborate seed crystal, wherein the temperature of the mixed solution containing flux obtained from step a-2) is reduced rapidly by 5-10° C., and the melt mixture is kept for 2-6 hours at each temperature; the temperature reducing and holding process is repeated until a floating crystal is observed on a surface of the mixed solution; then the temperature is slowly decreased at a rate of 0.5-10° C./d until crystallization is completed; thereafter the temperature is reduced at a rate of 10-50° C./h to room temperature, and the lithium metaborate seed crystal is obtained;

or, fixing a platinum wire to a seed rod and placing the platinum wire into the mixed solution containing flux obtained from step b-2); slowly reducing the temperature at a rate of 1-5° C./h until a crystal forms on the platinum rod; thereafter rotating the rod at a rate of 0-30 r/min, reducing the temperature at a rate of 0.1-10° C./d, and lifting the crystal out of the solution when the lithium metaborate seed crystal grows into a desired size; then decreasing the temperature to room temperature at a rate of 10-50° C./h and obtaining the lithium metaborate seed crystal;

c-2) placing the platinum crucible that contains the mixed solution obtained from step a-2) into a crystal growth furnace, fixing the lithium metaborate seed crystal obtained from step b-2) to a seed rod, decreasing the temperature of the crystal growth furnace to 560-850° C., and placing the rod into the hearth from the top of the crystal growth furnace; preheating the lithium metaborate seed crystal for 1-30 minutes above the surface of the mixed solution and then moving the lithium metaborate seed crystal down to or beneath the surface of the mixed solution for remelting; holding the temperature for 1-20 minutes before reducing the temperature to 550-844° C.;

d-2) reducing the temperature slowly at a rate of 0.1-5° C./d and rotating the rod at a rate of 0-30 r/min, and lifting up the lithium metaborate seed crystal at a rate of 0-10 mm/h simultaneously; then lifting the lithium metaborate seed crystal out of the mixed solution when the lithium metaborate seed crystal grows into a desired size and reducing the temperature to room temperature at a rate of 5-50° C./d; thereafter collecting the lithium metaborate seed crystal from the hearth to obtain lithium metaborate crystal in centimetre-size.

2. The method according to claim 1, wherein said melt method comprises top seeded melting method, Czochralski method, Kyropoulos method and Bridgman-Stockbarger method.

3. The method according to claim 1, wherein said lithium-containing compound and boron-containing compound have purity of ≥99.0%.

4. The method according to claim 1, wherein said flux has purity of ≥99.0%.

* * * * *